United States Patent
Joelsson

(10) Patent No.: US 11,373,846 B2
(45) Date of Patent: Jun. 28, 2022

(54) ARC SOURCE SYSTEM FOR A CATHODE

(71) Applicant: IMPACT COATINGS AB (PUBL), Linköping (SE)

(72) Inventor: Torbjörn Joelsson, Linköping (SE)

(73) Assignee: IMPACT COATINGS AB (PUBL), Linköping (SE)

( * ) Notice: Subject to any disclaimer, the term of this patent is extended or adjusted under 35 U.S.C. 154(b) by 0 days.

(21) Appl. No.: 17/252,130

(22) PCT Filed: Jun. 14, 2019

(86) PCT No.: PCT/EP2019/065703
§ 371 (c)(1),
(2) Date: Dec. 14, 2020

(87) PCT Pub. No.: WO2020/002007
PCT Pub. Date: Jan. 2, 2020

(65) Prior Publication Data
US 2021/0257190 A1      Aug. 19, 2021

(30) Foreign Application Priority Data

Jun. 27, 2018  (SE) .................... 1850797-0

(51) Int. Cl.
*H01J 37/32*       (2006.01)
*C23C 14/34*       (2006.01)

(52) U.S. Cl.
CPC .... *H01J 37/32614* (2013.01); *C23C 14/3407* (2013.01); *H01J 37/32055* (2013.01)

(58) Field of Classification Search
CPC ................ C23C 14/3407; C23C 14/35; H01J 37/32055; H01J 37/32605;
(Continued)

(56) References Cited

U.S. PATENT DOCUMENTS 3,625,848 A * 12/1971 Snaper .................. C23C 14/325
                                                              204/192.38
4,448,652 A *  5/1984 Pachonik ............ C23C 14/3407
                                                              204/192.15
(Continued)

FOREIGN PATENT DOCUMENTS

DE         4223091 C1      7/1993
DE         10126985 A1    12/2002
JP         2001-040467  *  2/2001
WO         2014172722 A1  10/2014

OTHER PUBLICATIONS

Machine Translation JP 2001-040467 (Year: 2001).*
(Continued)

*Primary Examiner* — Rodney G McDonald
(74) *Attorney, Agent, or Firm* — Tucker Ellis LLP

(57) ABSTRACT

An arc source system, comprising a cooling body (12) and a holder body (3) adapted to be detachably fastened to said cooling body and for holding a cathode body (4), wherein the system comprises a membrane (2) which is arranged between the holder body and a lower portion (14) of said cooling body; and wherein said lower portion (14) of said cooling body is provided with at least one cooling fluid channel (11), and wherein said holder body (3) is provided with an inner fastening arrangement configured to be coupled with a corresponding outer fastening arrangement on a cathode body (4).

14 Claims, 2 Drawing Sheets

(58) Field of Classification Search
CPC .. H01J 37/32614; H01J 37/34; H01J 37/3435; H01J 37/3497
USPC ........................................ 204/298.41, 192.38
See application file for complete search history.

(56) References Cited

U.S. PATENT DOCUMENTS

| | | | | |
|---|---|---|---|---|
| 5,259,941 | A * | 11/1993 | Munz | C23C 14/3407 |
| | | | | 204/192.12 |
| 5,421,978 | A | 6/1995 | Schuhmacher | |
| 5,616,226 | A | 4/1997 | Kunz | |
| 6,689,254 | B1 | 2/2004 | Hurwitt | |
| 7,632,383 | B2 | 12/2009 | Labalme | |
| 8,337,682 | B2 * | 12/2012 | Nishimura | C23C 14/325 |
| | | | | 204/298.41 |
| 2005/0133366 | A1 | 6/2005 | Aulagner | |
| 2005/0279629 | A1 | 12/2005 | Ulrich | |

OTHER PUBLICATIONS

International Search Report from corresponding International Application No. PCT/EP2019/065703, dated Sep. 6, 2019, 2 pages.
Swedish Search Report from corresponding Swedish Application No. 1850797-0, dated Feb. 11, 2019, 3 pages.
International Preliminary Report on Patentability from corresponding International Application No. PCT/EP2019/065703, dated Jul. 17, 2020, 18 pages.

* cited by examiner

ARC SOURCE SYSTEM FOR A CATHODE

TECHNICAL FIELD

The present invention relates to an arc source for a cathode, conventionally used in a sputtering process.

BACKGROUND

In sputtering processes particles are ejected from a solid target material, often to create thin films on a substrate material. The target, or cathode material is retained in so called arc sources or cathode clamping devices. The arc source is designed such that provides a uniform electric field gradient across the active sputtering region of the target material. Sputtering is done either using DC voltage (DC sputtering) or using AC voltage (RF sputtering). Sputter deposition is a physical vapor deposition (PVD) method of thin film deposition by sputtering. This involves ejecting material from a target that is a source onto a substrate such as a silicon wafer. One example is HIPIMS (high-power impulse magnetron sputtering) which is a method for physical vapor deposition of thin films which is based on magnetron sputter deposition. In addition to the sufficient power requirements in the sputtering process, the cooling of the target material is also quite critical, since about 80% of the power in the plasma is converted to heat, which must be removed since it would otherwise damage the target. Cooling is usually performed through a water-cooling system, where the arc source system provides the target material or the cathode with both cooling and current. Cooling of the target could either be done by direct contact of the cooling fluid or water with the target, if it's made of metal or through a backing plate, or indirect contact trough the arc source system or clamping device. However, even though direct contact is more efficient, problems with excess water in the deposition chamber may arise.

Conventionally the target or cathode is attached or clamped on or in the arc source system by an inner threaded portion of the material to evaporate. The construction with the inner threaded portion thus reduces the amount of material that can be used. The cathode is usually placed in connection with a rigid body, through which the cooling takes place, which is less efficient.

There is a need for an improved system, providing current and efficient cooling to the sputtering target or cathode.

SUMMARY

It is an object of the present disclosure, to provide an improved system for holding a sputtering target or cathode.

The invention is defined by the appended independent claims. Embodiments are set forth in the appended dependent claims and in the following description.

According to a first aspect there is provided an arc source system, comprising a cooling body and a holder body adapted to be detachably fastened to said cooling body and for holding a cathode body, wherein the system comprises a membrane which is arranged between the holder body and a lower portion of said cooling body; and in that said lower portion of said cooling body is provided with at least one cooling fluid channel, and wherein said holder body is provided with an inner fastening arrangement configured to be coupled with a corresponding outer fastening arrangement on a cathode body.

By this system there is provided an improved way of cooling the cathode body during the sputtering process. By the inner fastening arrangement being coupled to an outer fastening arrangement on the cathode body there is further provided a more effective use of the cathode, as well as a way of using more of the cathode material during the sputtering process.

The membrane allows for a more efficient thermal conduction from the cooling fluid, thus providing for a more efficient cooling of the cathode material. This means that more cathode material, i.e. the material used in a sputtering process can be utilized in the process.

The fastening arrangement may comprise an inner threaded portion of the holder portion, configured to be in a threaded coupling with a corresponding outer threaded portion of the cathode body, or a bayonet mount.

The threaded connection between the holder body and the cathode body ensures a safe and easy connection of the cathode body in the arc source system. Alternatively, a bayonet mount may also be sufficient, since the membrane will supply a certain degree of locking due to the pressure of the cooling fluid against the membrane.

The membrane may be made of copper, aluminum, or alloys or mixtures thereof.

This means that the membrane is made of a material having a good thermal conductivity, which material is preferably also electrically conductive. By good thermal conductivity is meant that the material provides a sufficient degree of cooling across the material, i.e. from the adjacent cooling fluid on one side to adjacent cathode body on the other side of the membrane.

According to one embodiment the membrane may be made from brass.

The membrane may have a thickness in the range of 0.2 to 5 mm, or in the range of 0.5 to 2 mm.

The holder body may be detachably fastened to said cooling body by at least two fastening devices.

The fastening devices may further be arranged to engage said membrane.

The holder body may be made from a solid body provided with a circular aperture for receiving and holding said cathode body and the aperture may define an area where said membrane is adjacent to a lower portion of said cathode body, when said cathode body is held in said holder body.

This means that the membrane may lie against the bottom of the cathode during use, and through the thermally conductive properties of the material the cooling fluid may cool the cathode material.

According to one embodiment of the first aspect, an upper portion of the cooling body comprises at least one cooling fluid inlet and at least one cooling fluid outlet, wherein said inlet and outlet are connected to said at least one fluid cooling channel. The inlet, outlet and channel thus forms a cooling fluid circuit.

According to yet an alternative of the first aspect a magnet body may be arranged at an upper portion of the cooling body, and a magnet holder may be arranged to enclose an iron core. A lower portion of the magnet holder may be arranged to abut said magnet body.

The iron core may be arranged between said magnet body and an adaptor.

This arrangement and design provides for an efficient use and distribution of the cathode material.

According to an embodiment the system is adapted to receive and hold a circular cathode body.

According to a second aspect there is provided a circular cathode body for used in the arc source system as defined in the first aspect, wherein said cathode body is provided with a fastening arrangement on an outer lower portion thereof, adapted to be coupled with a corresponding fastening arrangement on a holder body of the arc source system.

The fastening arrangement may be an outer threaded portion on an outer lower portion thereof adapted to be coupled with a corresponding inner threaded portion of a holder body of said arc source system; or said fastening arrangement may alternatively be a bayonet mount.

According to a third aspect there is provided the use of a cathode body according to the second aspect, in an arc source system according to the first aspect.

According to a fifth aspect there is provided the use of an arc source system according to the first aspect and a cathode body according to the second aspect in a sputtering process.

By sputtering process is meant any process where solid materials are used.

BRIEF DESCRIPTION OF DRAWINGS

Embodiments of the present solution will now be described, by way of example, with reference to the accompanying schematic drawings.

DESCRIPTION OF EMBODIMENTS

Figure 1:
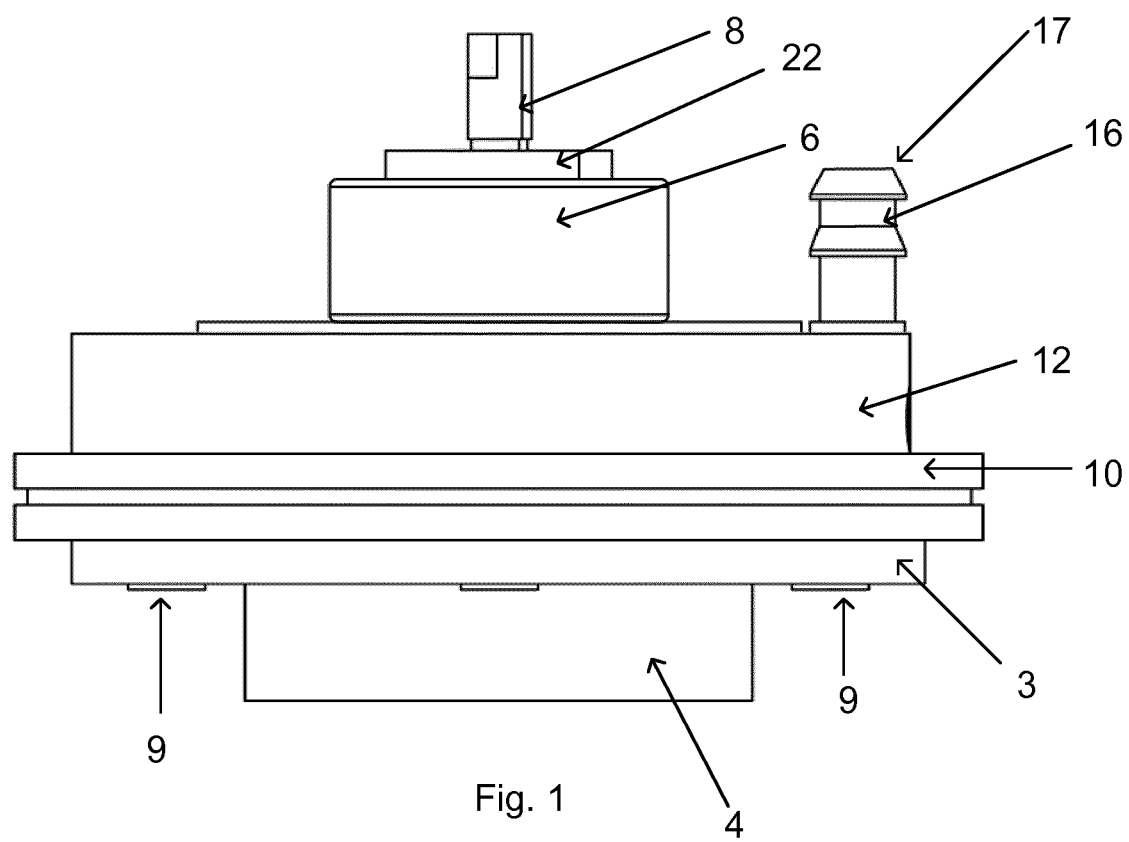
FIG. 1 is a schematic side view of an arc source system.
Figure 3:
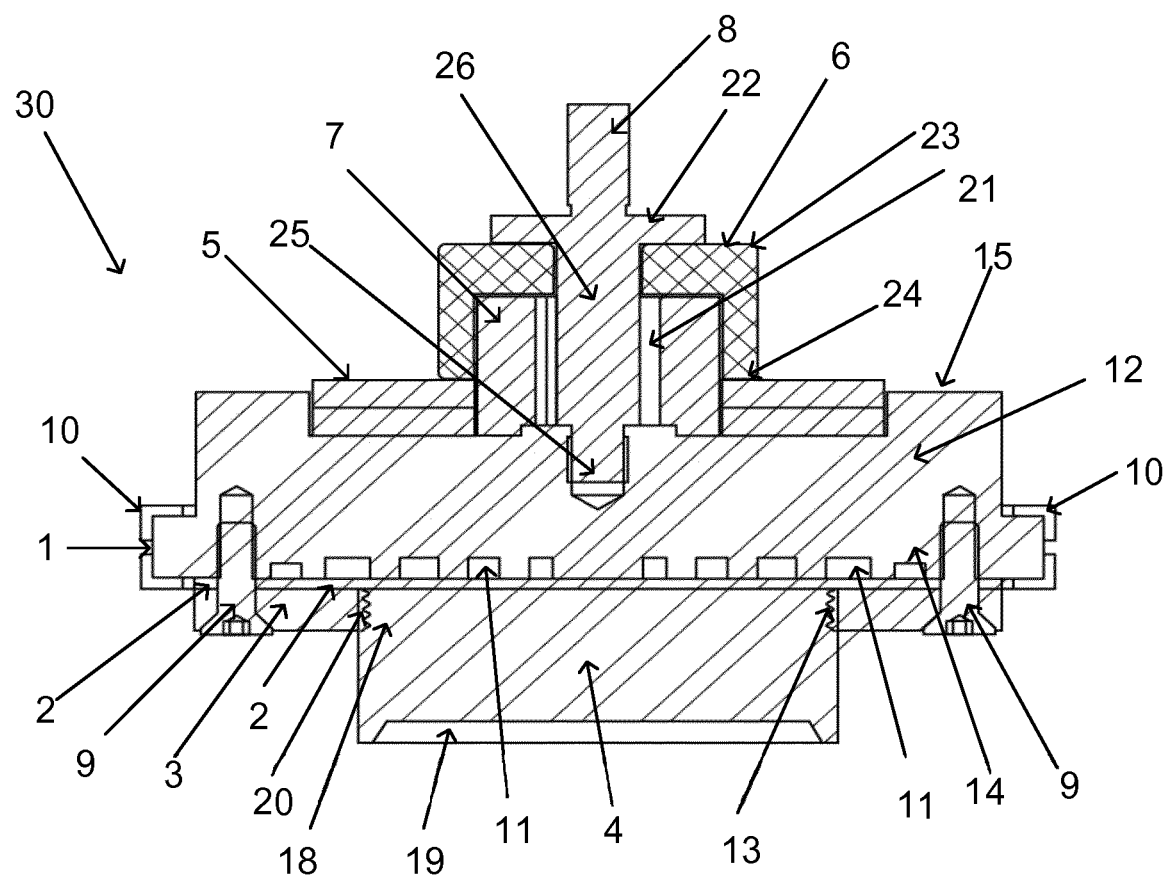
FIG. 3 is a cross sectional view of an arc source system along the line D-D of FIG. 2.
Figure 4:
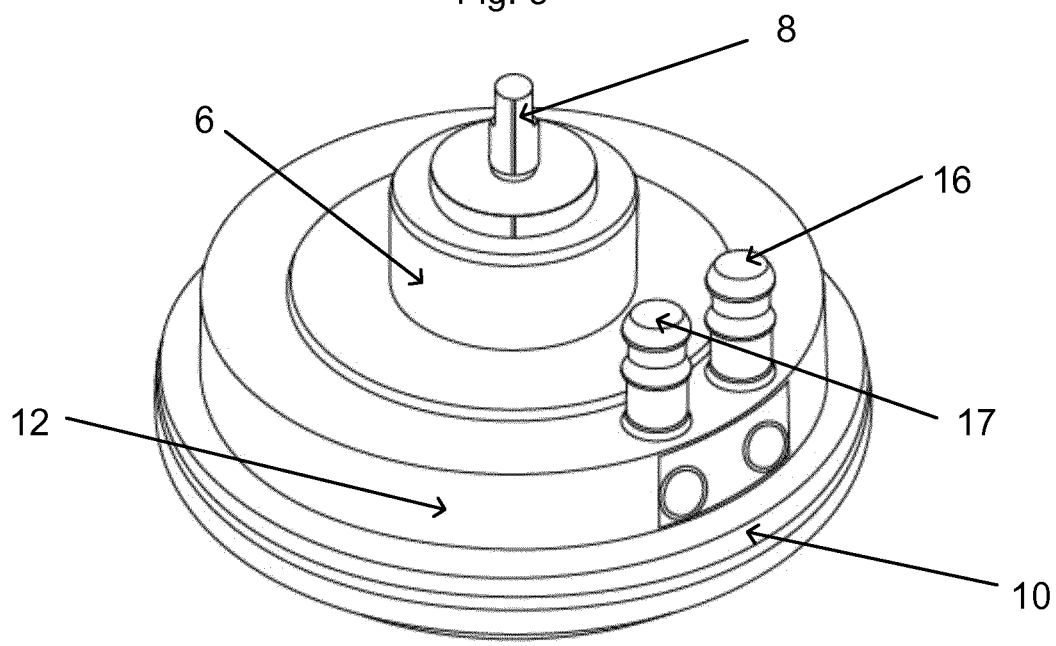
FIG. 4 is a schematic perspective view of an arc source system.

As illustrated in FIG. 1 the arc source system 30 comprises a cooling body 12 and a holder body 3. Current or power is fed to the cathode body 4, through an adaptor 8. At least one water inlet 16 and at least one water outlet 17 may be arranged in an upper portion 15 of the cooling body 12 (also as shown in FIG. 4). Alternatively, these inlets and outlets may be arranged in a different portion of the cooling body. The inlet and outlet are connected to at least one cooling fluid channel 11, thus forming a cooling fluid circuit, which at least one channel is arranged in a lower portion 14 of the cooling body (as shown in FIG. 3).

The arc source system 30 may further comprise an insulation ring 10 arranged around the lower portion of the cooling body.

The lower portion of the cooling body is provided with receiving means for at least two fastening devices 9. These fastening devices 9 are provided to detachably secure a holder body 3 onto the cooling body 12.

The holder body 3 is arranged to retain or clamp a cathode body 4, i.e. the target material for the sputtering process.

Figure 2:
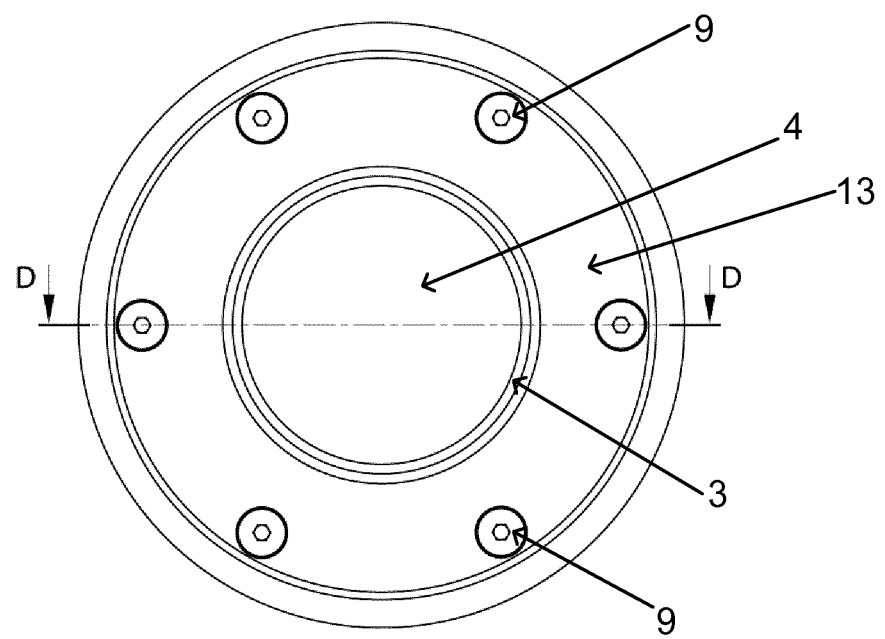
FIG. 2 is a schematic bottom view of an arc source system.

In FIG. 2 illustrates the system as shown in FIG. 1 where the cathode body 4 is placed in the holder body 3. The holder body 3 is fastened to the cooling body 12 by the fastening devices 9.

According to one embodiment the fastening devices 9 may be any one of a screw, pin or rivet. Preferably the fastening device is a screw which is fastened and secured into the lower portion of the cooling body.

As illustrated in the drawings the cathode body 4 is arranged in a circular aperture of the holder body 3. The holder body is made from a solid body provided with the circular aperture for receiving and holding said cathode body. The outer circumference of the holder body may however have any configuration even though is depicted as circular in the drawings.

In FIG. 3 the system is illustrated in more detail, as a cross-sectional view along the line D-D in FIG. 3.

A membrane 2 is arranged between the lower portion 14 of the cooling body 12 and the cathode body 4 (when arranged in connection with the holder body).

The membrane 2 has a thickness, as seen in a vertical direction from the cathode body to the cooling body, in the range of 0.2 to 5 mm, or preferably in the range of 0.5 to 2 mm. Most preferably the thickness is about 0.5 mm.

The membrane is thus arranged between the cooling body and the cathode, and such that the fluid in the cooling fluid channels directly come into contact with the upper surface thereof, while the lower surface of the membrane 2 abuts the cathode body.

The membrane is detachably fastened to the cooling body through the fastening devices 9. This means that the membrane has a width that is larger than the width of the aperture in the holder body in which the cathode body is retained. This provides sufficient sealing to not allow any cooling fluid into a deposition chamber.

The membrane may also be clamped between the cathode and cooling body.

The membrane is formed from a material which is preferably both thermally and electrically conductive. This means that the current fed into the arc source system through the adaptor 8 is transferred trough the cooling body and the membrane to the cathode body 4.

Alternatively, but not preferred, the membrane may be formed by a thermally conductive, but electrically insulating material. The arc source system is then configured such that the current is provided to the cathode body by other means.

The membrane 2 may according to one embodiment be formed from a suitable metal. Examples of such metals are copper, aluminum or alloys or combinations thereof.

In one embodiment the membrane is formed from or of brass.

The cathode body 4 may be formed from any suitable metal, non-metal or combinations thereof.

The cathode body 4 is preferably formed as a circular body, having an upper portion 19 facing a deposition chamber (not shown) and a lower portion 18 facing the membrane 2, when the cathode body is placed in the holder. The cathode body 4 comprises a fastening arrangement such that is can be detachably fastened or attached to the holder body 3. In one embodiment the outer lower portion 18 of the circular body is provided with a threaded portion 20. This threaded portion is designed such that it corresponds to an inner threaded portion 13 arranged in the circumference of the aperture in the holder body 3. This means that the cathode body may be in a threaded connection to the holder body.

In an alternative embodiment (not shown in the drawings) the fastening arrangement is a bayonet mount or bayonet connector, which is well known to the skilled person and conventionally comprises a cylindrical male side (i.e. in the holder body) with one or more radial pins, and a female receptor (i.e. the cathode body) with matching L-shaped slot(s) and with spring(s) to keep the two parts locked together.

As further illustrated in FIG. 3 the arc source system 30 may comprise an adaptor 8, which is provided for feeding current to the cathode body 4. In the drawings the adaptor is shown to be in threaded connection 25 with the cooling body 12, but the adaptor may have any suitable configuration or function. The threaded portion 25 may have a diameter which is smaller than a main body portion 26 of the adapter.

The system 30 may further comprise a magnet body 5 arranged at an upper portion of said cooling body 12. The magnet 5 may be held in place by a magnet holder 6 formed from a polymer or plastic material. A lower portion 24 of the magnet holder 6 may be arranged such that it lies against or abuts the magnet body.

The system may further comprise an iron core 7, which is arranged between the magnet body 5 and the adaptor 8. In one embodiment the lower portion of the iron core 7 may be enclosed by the magnet body 5.

As illustrated in FIG. 3 a void space 21 may be provided between the adaptor 8 and the iron core 7.

The adapter 8 may further be provided with a protruding circular disc 22 arranged to abut on an upper portion 23 of the magnet holder 6.

The invention claimed is:

1. An arc source system, comprising:
a cooling body comprising a lower portion and an upper portion;
a holder body detachably fastened to said cooling body by at least two fastening devices, the holder body configured to hold a cathode body; and
a membrane clamped between the holder body and the lower portion of said cooling body, the membrane having a thickness in the range of 0.5 mm to 2 mm; and
wherein said lower portion of said cooling body is provided with at least one cooling fluid channel that is in fluid communication with the membrane, and
wherein said holder body is provided with an inner fastening arrangement that couples with a corresponding outer fastening arrangement on the cathode body, the inner fastening arrangement being one of a threaded portion or comprising at least one radial pin, and
wherein the membrane provides locking pressure against the cathode body through an opening in the holder body inscribed by the inner fastening arrangement due to pressure of cooling fluid in the cooling fluid channel acting against the membrane.

2. The arc source system as claimed in claim 1, wherein the membrane is made of copper, aluminum, or alloys or mixtures thereof.

3. The arc source system as claimed in claim 2, wherein said membrane is made from brass.

4. The arc source system as claimed in claim 1, wherein said holder body is made from a solid body provided with a circular aperture comprising the inner fastening arrangement for receiving and holding said cathode body.

5. The arc source as claimed in claim 4, wherein the cathode body comprises an upper portion configured to face a deposition chamber and a lower portion facing the membrane, wherein said aperture defines an area where said membrane is adjacent to the lower portion of said cathode body, when said cathode body is held in said holder body.

6. The arc source system as claimed in claim 1, wherein the upper portion of the cooling body comprises at least one cooling fluid inlet and at least one cooling fluid outlet, wherein said inlet and outlet are connected to said at least one fluid cooling channel.

7. The arc source system as claimed in claim 1, further comprising a magnet body arranged at the upper portion of said cooling body, and a magnet holder arranged to enclose an iron core and wherein a lower portion of said magnet holder is arranged to abut said magnet body.

8. The arc source system as claimed in claim 7, wherein said iron core is arranged between said magnet body and an adaptor.

9. The arc source system as claimed in claim 1, wherein said system is adapted to receive and hold a circular cathode body.

10. A circular cathode body for the arc source system as claimed in claim 1, wherein said cathode body is provided with the outer fastening arrangement on an outer lower portion thereof.

11. The cathode body as claimed in claim 10, wherein said outer fastening arrangement is an outer threaded portion or a receptor for the at least one radial pin.

12. The arc source system as claimed in claim 1, wherein the fastening devices that fasten the cooler body to the holder body engage the membrane.

13. The arc source system as claimed in claim 1, wherein the fastening devices that fasten the cooler body to the holder body secure the membrane between the cooler body and the holder body.

14. The arc source system as claimed in claim 1, wherein the membrane has a lateral extent dimensioned to cover a surface of the holder body that is adjacent the cooling body.

* * * * *